United States Patent [19]

Lewis et al.

[11] 4,392,104

[45] Jul. 5, 1983

[54] DIELECTRIC TEST UNIT

[75] Inventors: James C. Lewis; Jerry W. Miller, both of Abbeville; Clyde D. Simpson, Calhoun Falls; Ronald G. Thomasson, Abbeville, all of S.C.

[73] Assignee: Automation Industries, Inc., Greenwich, Conn.

[21] Appl. No.: 168,437

[22] Filed: Jul. 10, 1980

[51] Int. Cl.³ .......................................... G01R 31/12
[52] U.S. Cl. ...................................... 324/54; 324/64
[58] Field of Search ........................ 324/54, 52, 64; 340/647

[56] References Cited

U.S. PATENT DOCUMENTS

| | | | |
|---|---|---|---|
| 2,360,944 | 10/1944 | Fruth | 340/647 |
| 3,781,666 | 12/1973 | Dornberger | 324/54 |
| 3,890,566 | 6/1975 | Nordblad et al. | 324/54 |

FOREIGN PATENT DOCUMENTS

| | | | |
|---|---|---|---|
| 491800 | 2/1930 | Fed. Rep. of Germany | 324/54 |
| 174333 | 2/1923 | United Kingdom | 324/54 |

*Primary Examiner*—Stanley T. Krawczewicz
*Attorney, Agent, or Firm*—Francis N. Carten

[57] ABSTRACT

Apparatus and a method for testing the dielectric integrity of an insulated conductor wherein the conductor is immersed in a flowable mass of metal beads and a voltage potential is established between the conductor and the mass of beads to sense any current flow therebetween.

12 Claims, 5 Drawing Figures

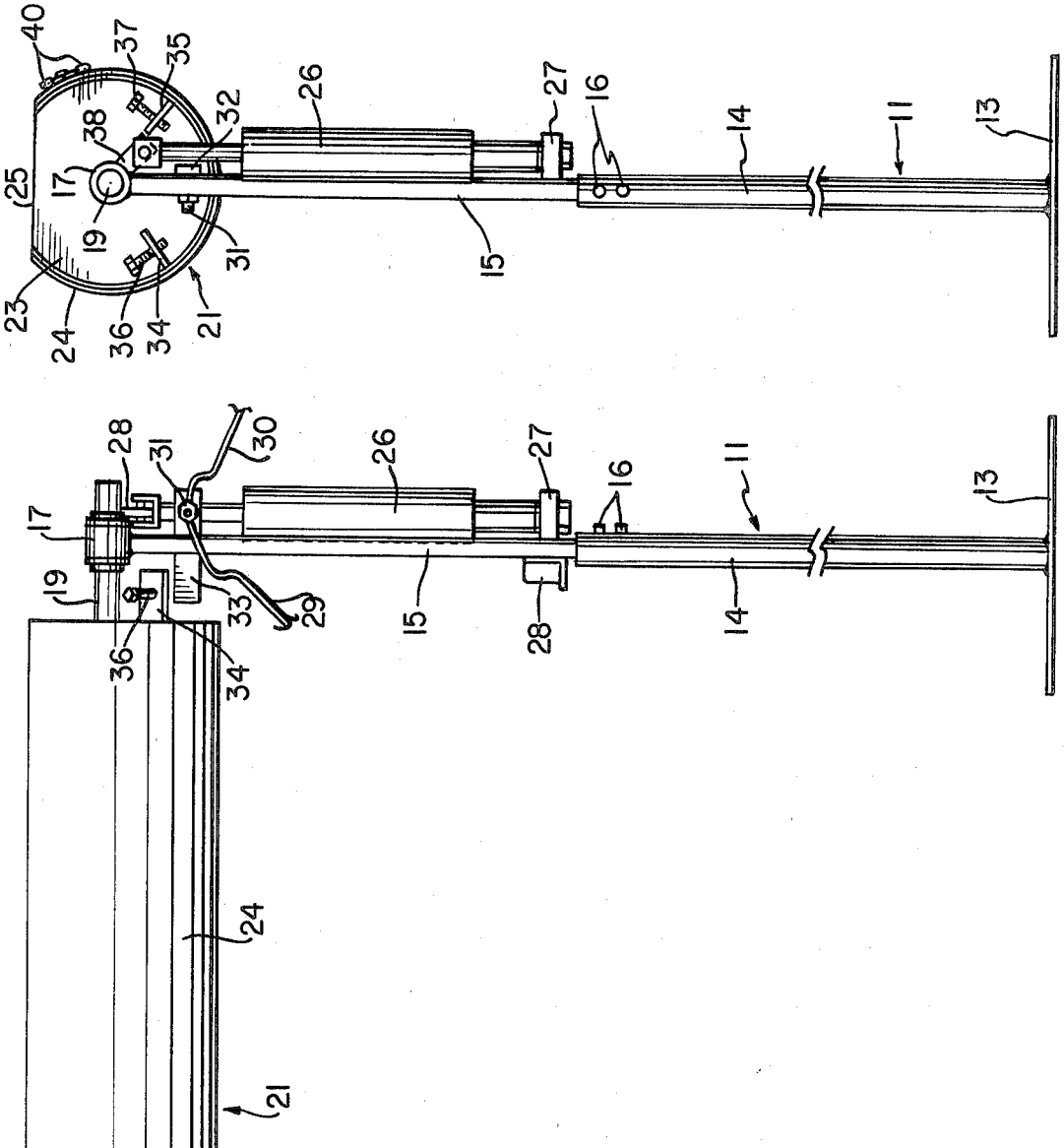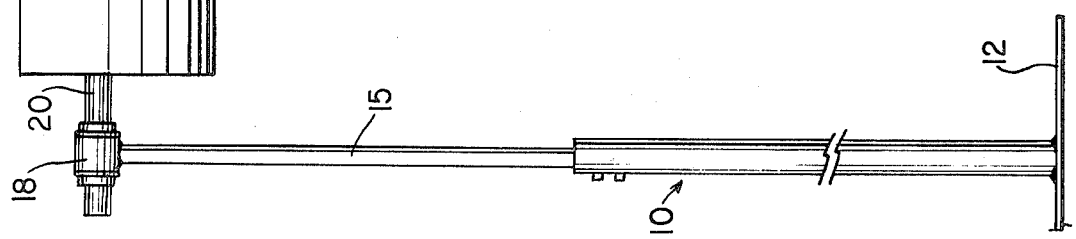

DIELECTRIC TEST UNIT

BACKGROUND OF THE INVENTION

Electrically conductive helically fabricated flexible hose in common use for vacuum cleaners and other purposes is constructed of one or more open-turn helices of insulated wire covered with a convoluted flexible plastic wall. The wires serve not only as a structural support for the hose wall but also as circuit means for carrying electlrical current from one end of the hose to the other. Product quality control standards require that each length of such hose be tested to insure the dielectric integrity of the insulation around the conductor.

The convoluted exterior of hose of this kind has presented a problem in test procedure. Heretofore the accepted practice has been to wrap each length of hose with aluminum foil conforming closing to the irregular shape of the hose and then to apply a voltage between the conductor of the hose and the foil. Any leakage of current indicates a failure of the dielectric integrity of the sample and it is rejected. It is an extremely time consuming matter to wrap and unwrap each hose in this procedure and of course the foil must be frequently replaced.

The present invention has as its principal object the provision of apparatus and a method for carrying out such tests rapidly, accurately and easily with no use of consumable materials such as foil.

STATEMENT OF THE INVENTION

The invention provides apparatus for testing dielectric integrity of a conductor surrounded by insulation comprising a receptacle formed with an opening and having an axis of rotation. Means are included for rotating the receptacle about the axis between first and second positions. Support means are included within the receptacle for receiving the insulated conductor through the opening. A flowable mass of electrically conductive beads is disposed within the receptacle to a level such that in the first position an insulated conductor held by the support means is above the bead mass but in the second position said conductor is immersed within the bead mass. Circuit means are included for establishing a voltage potential difference between the conductor and mass of beads and for sensing any electrical current flowing therebetween.

While this form of test apparatus can be used for electrical products other than vacuum cleaner hose, in its preferred form for testing extended conductors the receptacle is a trough having an extended longitudinal open slot.

The invention also contemplates a method which comprises the steps of immersing the insulaton in a flowable mass of electrically conductive beads, then establishing a voltage potential difference between the conductor and the mass of beads, and finally sensing any electrical current flowing between the conductor and the mass of beads.

BRIEF DESCRIPTION OF THE DRAWINGS

FIG. 1 is a front elevation partly broken away of the test apparatus of the invention;
FIG. 2 is an end elevation of the apparatus of FIG. 1.

DESCRIPTION OF PREFERRED EMBODIMENT

Flexible vacuum cleaner hose of the type to be tested in accordance with the invention is made of a pair of coaxial pre-formed helices of wire, each wire being coated with plastic and the entire helical assembly being wrapped about with helically applied strips of plastic forming a flexible wall. The outside of such a hose has a helically convoluted appearance. In use an electrical circuit is established through the wires so that a powered device such as a rotary brush can be activated at the wand end of the hose remote from the power unit. For the safety of the operator it is important that the dielectric integrity of the insulation be complete in every manufactured article and for this reason every length of such hose should be tested for defects in the electric insulation. It will be apparent from the following description that the apparatus and method of the invention is applicable not only to electrical hose as described above but also to other extended electrically conductive articles and indeed for electrical conductor which are not of extended length.

Figure 3:
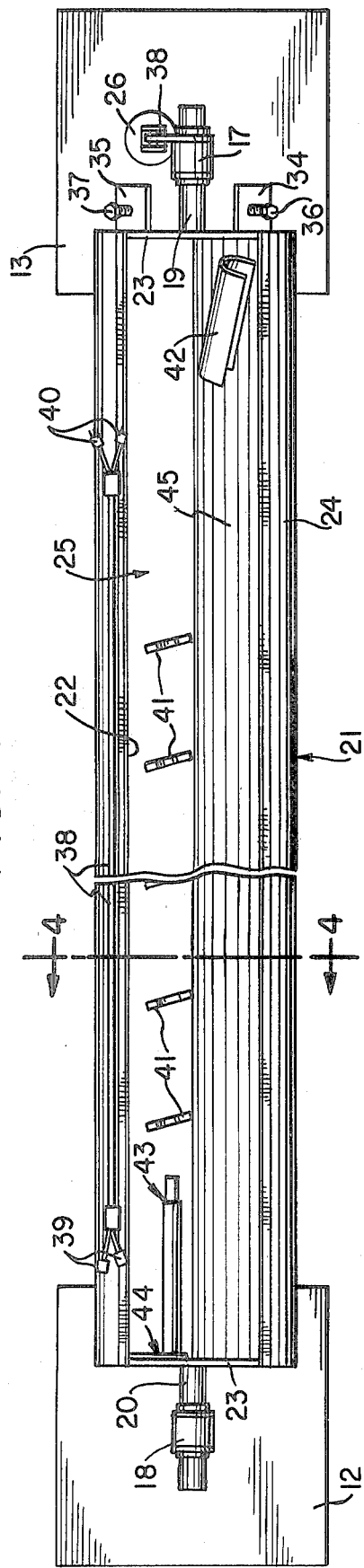
FIG. 3 is a plan view of the FIGS. 1 and 2 apparatus.

Referring now to FIGS. 1 through 3 the apparatus includes a pair of standards 10 and 11 mounted on respective base plates 12 and 13. The standards are of two-piece telescopic construction of similar design and therefore only the standard 11 need be described in detail. It includes a lower cylinder 14 into which is fitted an upper post 15, the vertical position of which is variable and can be fixed by screws 16. At the upper end of the post 15 is a bearing or trunnion 17 paired with a corresponding trunnion 18 on the post of the opposite standard 10. An axle 19 extends rotatably through the trunnion 17 and a similar axle 20 extends through the trunnion 18.

Mounted between the axles 19 and 20 is an extended cylindrical trough 21. The trough includes an electrically conductive metal liner 22 closed at its ends with metal endplates 23, one of which is shown in FIG. 2. A layer of plastic electrical insulation 24 covers the entire liner 22 and endplates 23. The trough is formed with an extended longitudinal open slot 25 from one end plate 23 to the other and this slot constitutes a segment of approximately ninety degrees of the trough cross section.

It is intended that the trough be very close to horizontal during operation and it is for this purpose that an adjustment of the height of the trunnion 17 and 18 can be made by the screws 16.

Turning now to FIGS. 1 and 2, the right end of the assembly on the standard 11 is shown to include a hydraulic cylinder 26 mounted between a support plate 27 and a crank arm 27a extending from the axle 19. The operation of the cylinder 26 is controlled by a hydraulic regulator 28 mounted on the post 15. An air supply line 29 and an electrical power supply line 30 are also provided. A power control switch 31 is mounted on a bracket 32 extending transverse to the upper end of the post 15, and one end of the bracket 32 extends toward the endplate 23 of the trough to serve as a rotational stop plate 33. Corresponding stops 34 and 35 extend from the endplate 23 and is each equipped with a rotational control screw 36 and 37 to adjust their stop position.

Figure 5:
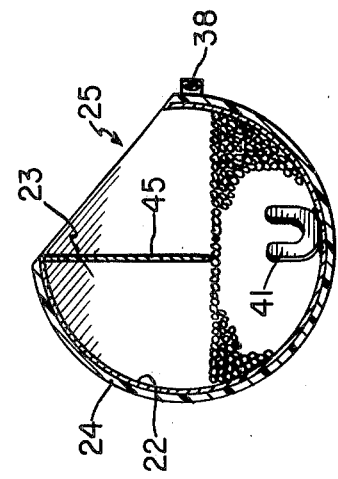
FIG. 5 is a similar section showing the trough in its second position.
Figure 4:
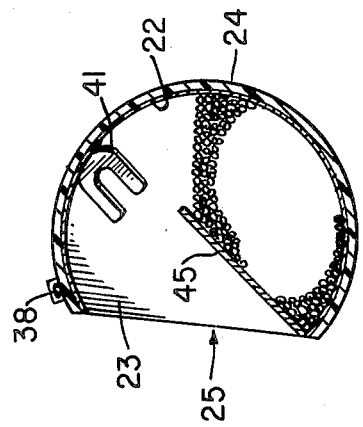
FIG. 4 is an enlarged section taken along the line 4—4 of FIG. 3 showing the trough in its first position.

As shown in FIGS. 3 to 5, an electrical conductor 38 extends throughout the length of the trough along the edge of the slot on the outside of the insulation 24. At its left end as shown in FIG. 3 it is equipped with female receptacles 39 and at its right end with male plugs 40. Inside the trough are a plurality of U-shaped clips 41 mounted on the interior of the metal liner 22 and each is turned at a slight angle to the center-line of the trough corresponding to the pitch of the wire helices in the hose to be tested. A support bracket 42 extends from the trough at one end to hold the wand mounted on a vacuum cleaner hose and an end fitting support rod 43 is located on the endplate of the opposite end of the trough for receiving an appropriate fitting of the hose to be tested. This end fitting support rod may be held by a hinge 44 to permit it to be swung into and out of the position shown.

A baffle 45 extends throughout the length of and projects inwardly into the trough from one edge of the slot 25 as shown particularly in FIGS. 4 and 5. Within the trough is a flowable mass of hollow metal beads 46 each approximately one-eighth inch in diameter. They occupy a portion of the volume the interior of the trough as shown in FIGS. 4 and 5. In a first rotated position of the trough as shown in FIG. 4, where the rotational control screw 36 contacts the stop plate 33, the mass of beads is retained by the baffle 45 but cannot surge out of the trough. In the second rotated position of the trough shown in FIG. 5 approximately 130° from the first position, where the control screw 37 contacts the rotational stop plate 33, the mass of beads covers the clips 41 and extends as high as the inner edge of the baffle 45.

In the operation of the apparatus the trough is located in the first position as shown in FIG. 4 and a flexible hose is inserted through the opening 25 of the trough and snapped releaseably into the clips 41 so that it is parallel to the trough axis. Its wand is held by the bracket 42 and its end fitting is supported by the rod 43. The cylinder 26 is operated to turn the trough to the position shown in FIG. 5 and an electrical circuit is established by means of the conductor 38 from one end of the electrically conductive wires in the test sample and through the mass of beads 46 in the trough. In the FIG. 5 position of the trough the sample hose held by the clips 41 is totally immersed in the mass of beads 46 and they conform to the fully convoluted exterior surface of the sample. This insures that all areas of the product are tested for dielectrical integrity. The sensor means for detecting a current leakage is in all respects conventional and is not shown in the drawings. When the test is completed the cylinder is again operated to return the trough to the position shown in FIG. 4 so that the sample can be quickly removed and replaced by another.

We claim:

1. Apparatus for testing the dielectric integrity of an electrically insulated conductor comprising
   (a) a receptacle formed with an opening and having an axis of rotation,
   (b) means for rotating the receptacle about said axis between first and second positions,
   (c) support means within the receptacle for receiving the insulated conductor through the opening,
   (d) a flowable mass of electrically conductive beads within the receptacle to a level such that in the first position the insulated conductor held by the support means is above the bead mass but in the second position said conductor is immersed with the bead mass, and
   (e) circuit means for establishing a voltage potential between the conductor and mass of beads and for sensing any electrical current flowing therebetween.

2. Apparatus for testing the dielectric integrity of a length of extended electrically insulated conductor comprising
   (a) a trough formed with an extended longitudinal open slot and having a longitudinal axis of rotation,
   (b) an axle at least one end of the trough for rotating the trough about said axis between first and second positions,
   (c) support means within the trough for receiving the insulated conductor through the slot and holding it substantially parallel to said axis,
   (d) a flowable mass of metal beads within the trough to a level such that in the first position an insulated conductor held by the support means is above the bead mass but in the second position said conductor is immersed within the bead mass, and
   (e) circuit means for establishing a voltage potential between the conductor and mass of beads and for sensing any electrical current flowing therebetween.

3. Apparatus according to claim 2 which includes a baffle extending throughout the length of and projecting inwardly into the trough from one edge of the slot for preventing the mass of beads from surging out of the trough when turned from the first to the second positions.

4. Apparatus according to claim 2 wherein the beads are hollow.

5. Apparatus according to claim 2 which includes hydraulic means for rotating the trough between its first and second positions.

6. Apparatus for testing the dielectric integrity of a length of extended electrically insulated conductor surrounded by insulation comprising
   (a) an electrically conductive horizontal cylindrical trough formed with an extended longitudinal open slot and having a longitudinal horizontal axis of rotation,
   (b) said trough being closed at its ends and being covered exteriorly with electrical insulation,
   (c) trunnions at opposite ends of the trough for rotating the trough about said axis between first and second positions,
   (d) support clips within the trough for receiving the insulated conductor through the slot and releaseably holding it substantially parallel to but spaced from said axis,
   (e) a flowable mass of metal beads within the trough to a level such that in the first position an insulated conductor held by the support clips is above the bead mass but in the second position said conductor is immersed within the beads mass, and
   (f) circuit means for establishing a voltage potential between the conductor and mass of beads for sensing any electrical current flowing therebetween.

7. Apparatus according to claim 6 which includes adjustable standards for supporting and leveling the trunnions at the opposite ends of the trough.

8. Apparatus according to claim 6 which includes a baffle extending throughout the length of and projecting inwardly into the trough from one edge of the slot for preventing the mass of beads from surging out of the trough when turned from the first to the second position.

9. Apparatus according to claim 6 wherein the beads are hollow.

10. Apparatus according to claim 6 which includes hydraulic means for rotating the trough between its first and second positions.

11. A method of testing the dielectric integrity of a length of extended electrically insulated conductor which comprises
   (a) disposing a flowable mass of metal beads within an extended open trough to a certain level,
   (b) holding the insulated conductor within the trough above the level of the beads,
   (c) rotating the trough about its longitudinal axis from a first to a second position between a quarter and a half turn so that the conductor is immersed within the mass of beads but the beads remain within the trough,
   (d) establishing a voltage potential between the conductor and the mass of beads,
   (e) sensing any electrical current flowing between the conductor and the mass of beads,
   (f) rotating the trough back to its first position, and
   (g) removing the insulated conductor from the trough.

12. A method of testing the dielectric integrity of a definite length of flexible hose having a convoluted exterior and including a helical insulated electrical which comprises:
   (a) inserting said hose length parallel to and within a trough and stopping it at a given position therewithin,
   (b) immersing the convoluted exterior or said hose length in said stopped position within a flowable mass of metal beads,
   (c) establishing a voltage potential difference between the conductor of the hose and the mass of beads, and
   (d) sensing any electrical current flowing between the conductor and the mass of beads, and
   (e) removing the hose length from the mass of beads.

* * * * *